United States Patent
Zweig et al.

(10) Patent No.: US 10,694,345 B2
(45) Date of Patent: Jun. 23, 2020

(54) AUTOMATED DETERMINATION OF NETWORKS MOTIFS

(71) Applicant: Technische Universität Kaiserslautern, Kaiserslautern (DE)

(72) Inventors: Katharina Anna Zweig, Hochspeyer (DE); Christian Brugger, Kaiserslautern (DE); Valentin Grigorovici, Iasi (RO); Christian De Schryver, Homburg (DE); Norbert Wehn, Queidersbach (DE)

(73) Assignee: Technische Universität Kaiserslautern, Kaiserslautern (DE)

( * ) Notice: Subject to any disclaimer, the term of this patent is extended or adjusted under 35 U.S.C. 154(b) by 422 days.

(21) Appl. No.: 15/579,518

(22) PCT Filed: May 18, 2016

(86) PCT No.: PCT/EP2016/000829
§ 371 (c)(1),
(2) Date: Dec. 4, 2017

(87) PCT Pub. No.: WO2016/192838
PCT Pub. Date: Dec. 8, 2016

(65) Prior Publication Data
US 2018/0160281 A1    Jun. 7, 2018

(30) Foreign Application Priority Data
Jun. 5, 2015    (EP) ..................................... 15001681

(51) Int. Cl.
*H04W 4/21*    (2018.01)
*G06F 17/16*    (2006.01)
(Continued)

(52) U.S. Cl.
CPC .............. *H04W 4/21* (2018.02); *G06F 17/16* (2013.01); *G06F 30/18* (2020.01); *H04L 67/22* (2013.01); *G06F 16/9024* (2019.01); *H04L 29/08* (2013.01)

(58) Field of Classification Search
CPC ................................ G06F 17/16; H04W 4/21
See application file for complete search history.

(56) References Cited

U.S. PATENT DOCUMENTS

| | | | |
|---|---|---|---|
| 7,788,123 B1 * | 8/2010 | Ekhaus ................. | G06Q 30/02 705/26.7 |
| 9,210,313 B1 * | 12/2015 | Svendsen ............... | G06F 16/50 |

(Continued)

OTHER PUBLICATIONS

Abufouda et al., "Interactions Around Social Networks Matter: Predicting the social network from associated interaction networks," 2014 IEEE/ACM International Conference on Advances in Social Networks Analysis and Mining, Aug. 17-20, 2014, pp. 142-145.

(Continued)

*Primary Examiner* — Chuong D Ngo
(74) *Attorney, Agent, or Firm* — Klarquist Sparkman, LLP

(57) ABSTRACT

The present invention relates to a computer-implemented method and a system for determining co-occurrences in at least one graph with n vertices and E edges, wherein each edge is defined by a pair of vertices, the method comprising: storing a binary adjacency matrix representing a first graph in a memory; performing a calculation step for the first graph, wherein the calculation step comprises: loading a block of at most K consecutive rows of the binary adjacency matrix from the memory and storing each row into one of K caches; streaming each of the subsequent uncached rows of the binary adjacency matrix from the memory; reading pairs of rows comprising a streamed row and each one of the (Continued)

cached rows; computing the logical conjunction between each couple of elements of the rows at the same position in the rows for each read pair of rows; and adding the results of the logical conjunction for all the couples of elements in each read pair by means of one-bit adders to obtain the co-occurrence, wherein the calculation step is repeated for consecutive blocks of rows in the binary adjacency matrix until all the pairs of rows of the binary adjacency matrix have been read.

19 Claims, 9 Drawing Sheets

(51) Int. Cl.
*H04L 29/08* (2006.01)
*G06F 30/18* (2020.01)
*G06F 16/901* (2019.01)

(56) References Cited

U.S. PATENT DOCUMENTS

| 2004/0204905 | A1 | 10/2004 | Huelsbergen et al. |
| 2013/0246146 | A1* | 9/2013 | Fischer ............ G06Q 30/0222 705/14.23 |
| 2015/0019639 | A1 | 1/2015 | Marlow et al. |

OTHER PUBLICATIONS

Clauset et al., "Hierarchical structure and the prediction of missing links in networks," Nature International Journal of Science, May 1, 2008, vol. 453, pp. 98-101.

Deane et al., "Protein Interactions: two methods for assessment of the reliability of high throughput observations," *Molecular & Cellular Proteomics 1.5*, May 2002, pp. 349-356.

Geng et al., "Interestingness Measures for Data Mining: A Survey," ACM Computing Surveys, Sep. 2006, vol. 38, No. 3, Article 9, pp. 1-32.

Horvát et al., A fixed degree sequence model for the one-mode projection of multiplex bipartite graphs, Social Network Analysis and Mining, Dec. 2013, vol. 3, Issue 4, pp. 1209-1224.

Horvát et al., "A Network-Based Method to Assess the Statistical Significance of Mild Co-Regulation Effects," PLOS ONE, Sep. 2013, vol. 8, Issue 9, pp. 1-14.

Liben-Nowell et al., "The Link-Prediction Problem for Social Networks," Journal of the American Society for Information Science and Technology, 2007, vol. 58, Issue 7, pp. 1019-1031.

Leicht et al., "Vertex similarity in networks," Phys. Rev. E, Feb. 2006, vol. 73, Issue 3, pp. 1-10.

Uhlmann et al., "Global microRNA level regulation of EGFR-driven cell-cycle protein network in breast cancer," Molecular Systems & Biology 2012, 8: 570, 2012, pp. 1-16.

Zweig et al., "A systematic approach to the one-mode projection of bipartite graphs," Social Network Analysis and Mining, Jul. 2011, vol. 1, Issue 3, pp. 187-218.

Zweig et al., "How to Forget the Second Side of the Story: A New Method for the One-Mode Projection of Bipartite Graphs," 2010 International Conference on Advances in Social Networks Analysis and Mining, Aug. 9-11, 2010, pp. 200-207.

Betkaoui et al., "A Framework for FPGA Acceleration of Large Graph Problems: Graphlet Counting Case Study," 2011 International Conference on Field-Programmable Technology (FPT), Dec. 12, 2011, pp. 1-8.

International Search Report and Written Opinion for PCT/EP2016/000829, dated Aug. 26, 2016, 10 pages.

Betkaoui et al., "A Framework for FPGA Acceleration of Large Graph Problems: Graphlet Counting Case Study," 2011 IEEE International Conference on Field-Programmable Technology (FPT), Dec. 2011, 8 pages.

International Preliminary Report on Patentability for PCT/EP2016/000829, dated Dec. 5, 2017, 8 pages.

* cited by examiner

700

701 — Repeating steps 502 to 506 of 500 to generate a plurality of random graphs from a first graph 702 — Repeating steps 202 to 207 of 200 to compute the co-occurrences 703 — Storing the co-occurrence for a pair of rows in the first graph and in all the random graphs in a result matrix in the memory 704 — Evaluating the statistical significance of the co-occurrence for the pair of rows in the first graph from the result matrix

END

Fig. 7

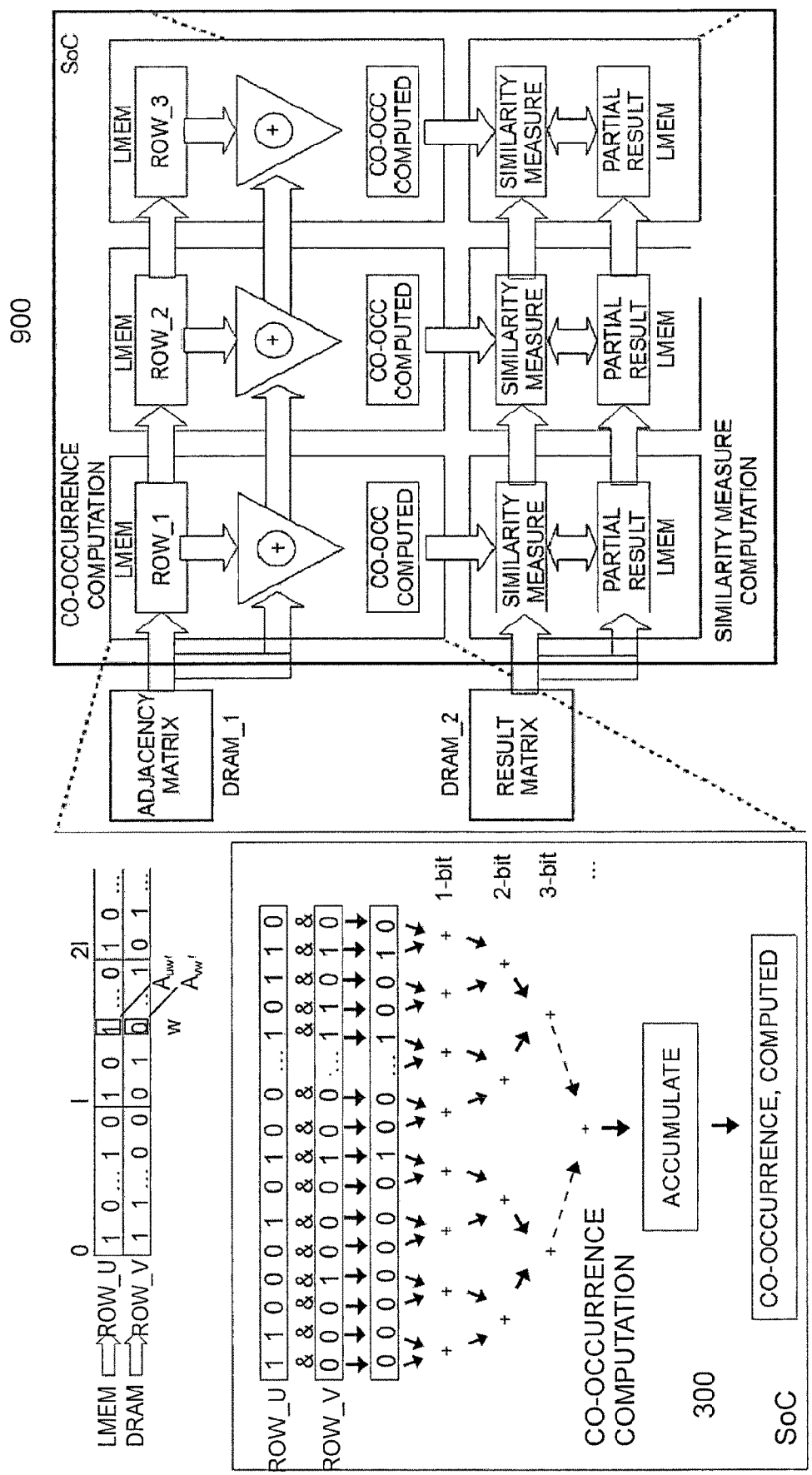
Fig. 8 (Part I)

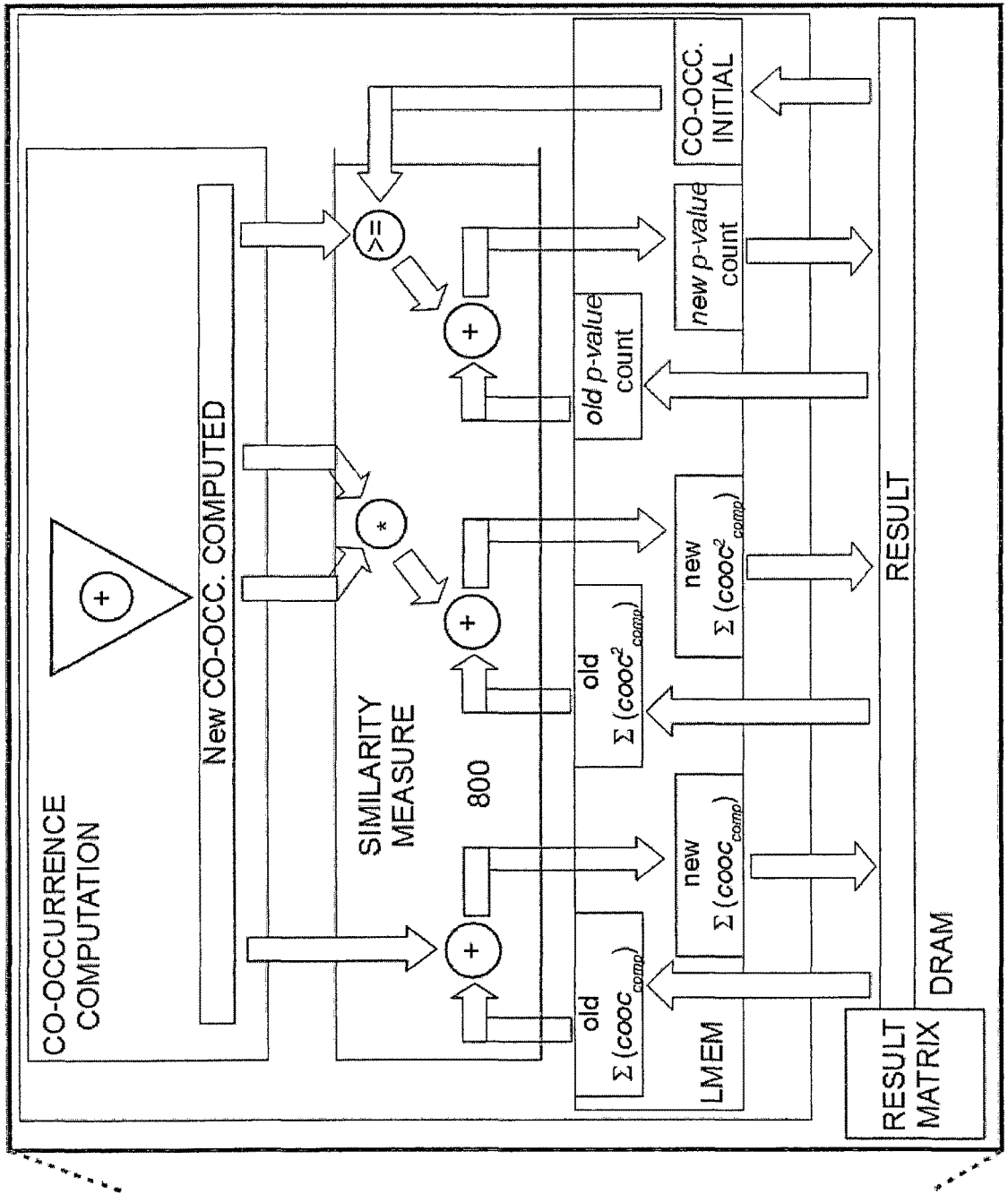
Fig. 8 (Part II)

AUTOMATED DETERMINATION OF NETWORKS MOTIFS

CROSS-REFERENCE TO RELATED APPLICATIONS

This is the U.S. National Stage of International Application No. PCT/EP2016/000829, filed May 18, 2016, which was published in English under PCT Article 21(2), which in turn claims the benefit of European Application No. 15001681.4, filed Jun. 5, 2015. The European application is incorporated herein in its entirety.

TECHNICAL FIELD

The following description relates to a method and a system for detecting network motifs in a graph, in particular considering as motifs the co-occurrences between pairs of vertices.

BACKGROUND

Graphs can be used to model large data sets in numerous fields, such as physics, computer science, biology and sociology. In particular, graphs can represent networks, i.e. systems with pairwise relations among their elements. The identification of recurrent patterns in these relations can provide valuable insight in the dynamics of a system. Therefore there is a need for a fast and reliable identification of so-called network motifs in networks, namely those patterns whose occurrence is statistically significant. The computational process of detecting patterns in large data sets on standard central processing unit (CPU)-based architectures and graphics processor unit (GPU)-based architectures is very time and energy consuming.

There are frameworks like GraphGen by Nurvitadhi et al. presented in 2014 or the Graphlet Counting Case Study by Betkaoui et al. in 2011 that generate specific data processing engines for particular graph operations. However, they are not application tailored and cover a broad range of graph problems instead of optimizing the performance for motif detection.

It is an object of the present invention to provide a method and a system for an efficient network motif detection in terms of throughput, energy and memory requirements. This object is solved by a method and a system defined in the independent claims. Preferred embodiments are subject of the dependent claims.

SUMMARY

According to one aspect of the present invention, there is provided a computer-implemented method for detecting co-occurrences in at least one graph with n vertices and E edges, wherein each edge is defined by a pair of vertices. A graph may be visualized as a set of circles (vertices) connected to each other by lines (edges) and may exemplarily be used to represent a social network. Each circle may be associated to a user and the lines connecting the circles may represent existing relations among the users, e.g. "friendships". Two chosen users who are not connected to each other may nonetheless share common friends in the social networks, namely users who are connected to both chosen users. The number of common friends is the co-occurrence between the two chosen users. In other words, the co-occurrence between two given vertices in a graph is the number of vertices that have edges connecting them to both of the given vertices.

The method comprises storing a binary adjacency matrix representing a first graph in a memory. As explained, a graph may be characterized by its vertices and the relations among them. If two vertices are connected, they are defined "adjacent". Given a pair of vertices, there are only two possible, mutually exclusive, scenarios: there exists an edge between the two vertices or there is no edge connecting the two vertices. Therefore the relation between a pair of vertices is in a binary state and may be mathematically described by two different values, one associated to an existing edge and the other associated to a non-existing edge. Exemplarily, the two values could be chosen to be '0' and '1'. A collection of 0s and 1s for each pair of vertices may thus fully represent a graph. A square matrix wherein each row (and each column) corresponds to a vertex may provide an appropriate structure for the collection of 0s and 1s. That is to say, the entry at the m-th row and n-th column indicates that there is no edge connecting the vertices m and n if it is equal to 0 and indicates the presence of an edge between vertices m and n if it is equal to 1. A binary digit, i.e. a digit that can assume only two values, may be stored in a single bit of a memory in a computer system. A memory is a data storage device that may comprise a plurality of memory cells, each cell to store one bit. One example of computing memory may be a dynamic random access memory (DRAM), which allows for high density of memory cells and therefore is suitable for storing a large amount of data. Such a memory may constitute the main memory of a computer system. A representation of a graph by means of a binary adjacency matrix may be considered advantageous, since each entry of the matrix requires only one bit. However, as explained in further detail with reference to FIG. 1, the operations to compute a co-occurrence may not be efficient per se when performed on the adjacency matrix. Nevertheless, in combination with a tailored architecture as described below, the use of the adjacency matrix leads to an efficient detection of co-occurrences.

The method further comprises performing a calculation step for the first graph, wherein the calculation step comprises loading a block of at most K consecutive rows of the binary adjacency matrix from the memory and storing each row into one of K caches; streaming each of the subsequent uncached rows of the binary adjacency matrix from the memory;
and reading pairs of rows comprising a streamed row and each one of the cached rows. A cache may be another computing memory, separated from the main memory into which the matrix is stored and with different features. In particular, a cache may be a type of memory that allows a computer system to access data stored therein faster with respect to the main memory. Typically, a cache may have a smaller size than the main memory. One example of a fast-access memory may be a static random access memory (SRAM), which does not need refresh as a DRAM and is thus faster. The provision of a plurality of caches for storing rows of the matrix solves the memory problems conventionally encountered when computing co-occurrence from an adjacency matrix. In particular, the computing algorithm is structured so that once a row has been stored into a cache, it is not necessary to load it a second time. When a row is streamed, the co-occurrence is computed between the streamed row and all the previously cached rows, which can quickly be accessed. A parallelization is therefore possible without increasing the bandwidth requirements for the main memory, because only one row is streamed from the main memory.

The calculation step further comprises computing the logical conjunction between each couple of elements of the rows at the same position in the rows for each read pair of rows and adding the results of the logical conjunction for all the couples of elements in each read pair by means of one-bit adders to obtain the co-occurrence. As explained above, the entry at the m-th row and n-th column of the adjacency matrix indicates whether there is an edge connecting the vertices m and n. The same holds of course for the entry at the p-th row and n-th column. If both entries are 1, it means there is an edge connecting vertices m and n and an edge connecting vertices p and n. In other words, n is adjacent to both m and p. Therefore computing the co-occurrence between two rows reduces to scanning the rows, checking if elements of the two rows belonging to the same column are both 1 and increasing a counter every time this condition is met. The operation of logical conjunction AND between two bits yields 1 if and only if both bits are 1 and is therefore suited for this purpose. The 1's resulting from the logical conjunction may then be added using one-bit adders, i.e. digital circuits capable of computing the sum between two one-bit numbers. Hence, using the binary adjacency matrix requires simple computational logic.

The calculation step is repeated for consecutive, blocks of rows in the binary adjacency matrix until all the pairs of rows of the binary adjacency matrix have been read. Exemplarily, the calculation step may be performed according to nested loops. That is to say, according to an internal loop, a first row may be streamed and cached. A second row may be streamed, its co-occurrence with the cached first row may be computed and then the second row may be cached as well. This process can continue until the caches are full. The subsequent rows may only be streamed and the co-occurrence with the cached rows may still be computed. Then the internal loop may start again, with the first row to be cached being the first row that could not be stored in a cache in the previous loop. All the rows that had been previously cached are no longer necessary, because the co-occurrences for all pairs containing these rows have been already computed. Only the rows subsequent to the first cached row in the new loop are needed. The internal loop may be repeated a number of times according to an external loop depending on the number k of caches and the number of rows in the matrix, until the co-occurrences for all the possible pairs of rows in the matrix are computed.

According to a preferred embodiment, the one-bit adders are combined to form an adder tree. Adders for arbitrarily large binary numbers can be constructed starting from one-bit adders. An adder tree is a combination of adders of different sizes hierarchically organized in stages according to the size of the adders: the first stage is formed by m one-bit adders, the second stage by m/2 two-bit adders and so on. The number of adders in the first stage defines the width of the adder tree. The number of stages defines the depth of the adder tree. The results from the i-th stage are supplied to the (i+1)-th stage. Organizing the adders in an adder tree makes the computation efficient by exploiting the associative property of the addition.

According to another preferred embodiment, the reading comprises reading the data from the rows in batches; the computing and the adding are performed separately for each batch, yielding an intermediate sum for each batch; and the intermediate sums are fed to an accumulator. Splitting the data into batches may be advantageous if the rows have a large number of elements.

According to yet another preferred embodiment, the method further comprises storing an array containing an adjacency list representing the first graph in the memory, wherein the elements of the array are the edges of the first graph. An adjacency list is another way of representing a graph, different from the adjacency matrix. In the adjacency list only the existing edges are stored and each edge is represented by a couple of integers. The integers are used to denote the vertices of the graphs, so that each edge is described by the pair of vertices it connects.

The method further comprises performing a generation step of a random graph by: performing at least once a swap randomization step comprising: randomly selecting two elements of the array; swapping the vertices between the edges corresponding to the two elements to obtain two swapped edges; checking whether the swapped edges are elements of the array; if both swapped edges are not elements of the array, modifying the array by deleting the randomly selected elements and inserting the swapped edges as two new elements; and modifying the binary adjacency matrix correspondingly to represent the random graph. A random graph generated from an original graph may be loosely considered as a graph that has the same vertices as the original graph but edges randomly drawn between the vertices. A comparison with a random graph may be useful in determining how significant a pattern in the original graph is. New random edges may be obtained from existing ones by swapping vertices between them. In other words, given two couple of integers (i.e. two edges), one integer of the first couple and one integer of the second couple exchange positions, yielding two new couple of integers (i.e. two swapped edges). In order to preserve the configuration of the original graph for the sake of the comparison, the swapped edges are only accepted when they did not exist prior to the swapping. The random selection of the two starting edges may preferably be accomplished by generating two random numbers and identifying two corresponding edges from the adjacency list. The step of checking whether the swapped edges already existed may be instead performed using the adjacency matrix.

The method additionally comprises repeating the generation step a plurality of times to generate a plurality of random graphs; performing the calculation step for each of the plurality of random graphs; storing the co-occurrence for a pair of rows in the first graph and the co-occurrence for the same pair of rows in each of the plurality of random graphs in a result matrix in the memory; and evaluating the statistical significance of the co-occurrence for the pair of rows in the first graph from the result matrix.

According to a further preferred embodiment, evaluating the statistical significance comprises: computing a mean value of the co-occurrences in the plurality of random graphs; and computing the difference between the co-occurrence in the first graph and the mean value.

According to another aspect of the present invention, there is provided a computer program product tangibly stored on a storage medium or implemented as data stream, the computer program product comprising computer-readable instructions, which, when loaded and executed on a computer system, cause the computer system to perform operations according to the method of any one of the preceding aspects.

According to a further aspect of the present invention, there is provided a computer system for detecting co-occurrences in at least one graph with n vertices and E edges, wherein each edge is defined by a pair of vertices, the system comprising: a memory to store a binary adjacency matrix representing a first graph; K caches to store consecutive rows of the binary adjacency matrix; and a plurality of one-bit adders. Preferably, the memory may be a dynamic random access memory and each of the K caches may be a static random access memory. Further preferably, each of the K caches may have a size of $2^j$ kB, with j being at least 8, and K may be in the range of at least 8 to 300.

The system further comprises at least one processing unit operable to perform a calculation step for the first graph, wherein the calculation step comprises:

loading a block of at most K consecutive rows of the binary adjacency matrix from the memory and storing each row into one of the K caches;

streaming each of the subsequent uncached rows of the binary adjacency matrix from the memory;

reading pairs of rows comprising a streamed row and each one of the cached rows;

computing the logical conjunction between each couple of elements of the rows at the same position in the rows for each read pair of rows;

adding the results of the logical conjunction for all the couples of elements in each read pair by means of the plurality of one-bit adders to obtain the co-occurrence;

wherein the calculation step is repeated for consecutive blocks of rows in the binary adjacency matrix until all the pairs of rows of the binary adjacency matrix have been read.

The at least one processing unit may preferably comprise a plurality of memory processors.

According to a preferred embodiment, the plurality of one-bit adders are combined to form an adder tree. The adder tree may preferably have a width of at least 128 adders at the top and a depth of at least seven stages.

According to another preferred embodiment, the system further comprises an accumulator. Moreover, the reading comprises reading the data from the rows in batches; the computing and the adding are performed separately for each batch, yielding an intermediate sum for each batch; and the intermediate sums are fed to the accumulator.

According to yet another preferred embodiment, the at least one processing unit is further operable to:

store an array containing an adjacency list representing the first graph in the memory, wherein the elements of the array are the edges of the first graph;

perform a generation step of a random graph by:

performing at least once a swap randomization step comprising:

randomly selecting two elements of the array;

swapping the vertices between the edges corresponding to the two elements to obtain two swapped edges;

checking whether the swapped edges are elements of the array;

if both swapped edges are not elements of the array, modifying the array by deleting the randomly selected elements and inserting the swapped edges as two new elements; and modifying the binary adjacency matrix correspondingly to represent the random graph;

repeat the generation step a plurality of times to generate a plurality of random graphs;

perform the calculation step for each of the plurality of random graphs;

store the co-occurrence for a pair of rows in the first graph and the co-occurrence for the same pair of rows in each of the plurality of random graphs in a result matrix in the memory; and evaluate the statistical significance of the co-occurrence for the pair of rows in the first graph from the result matrix.

BRIEF DESCRIPTION OF THE DRAWINGS

FIG. 7 shows an exemplary method of computing similarity measures starting from a plurality of random graphs generated according to the method in FIG. 5 and their co-occurrences computed according to the method in FIG. 2.

FIG. 8 shows a pictorial representation combining co-occurrence computation modules as in FIG. 3 and arithmetic modules for calculating similarity measures.

TECHNICAL TERMS AND DEFINITIONS

Figure 1:
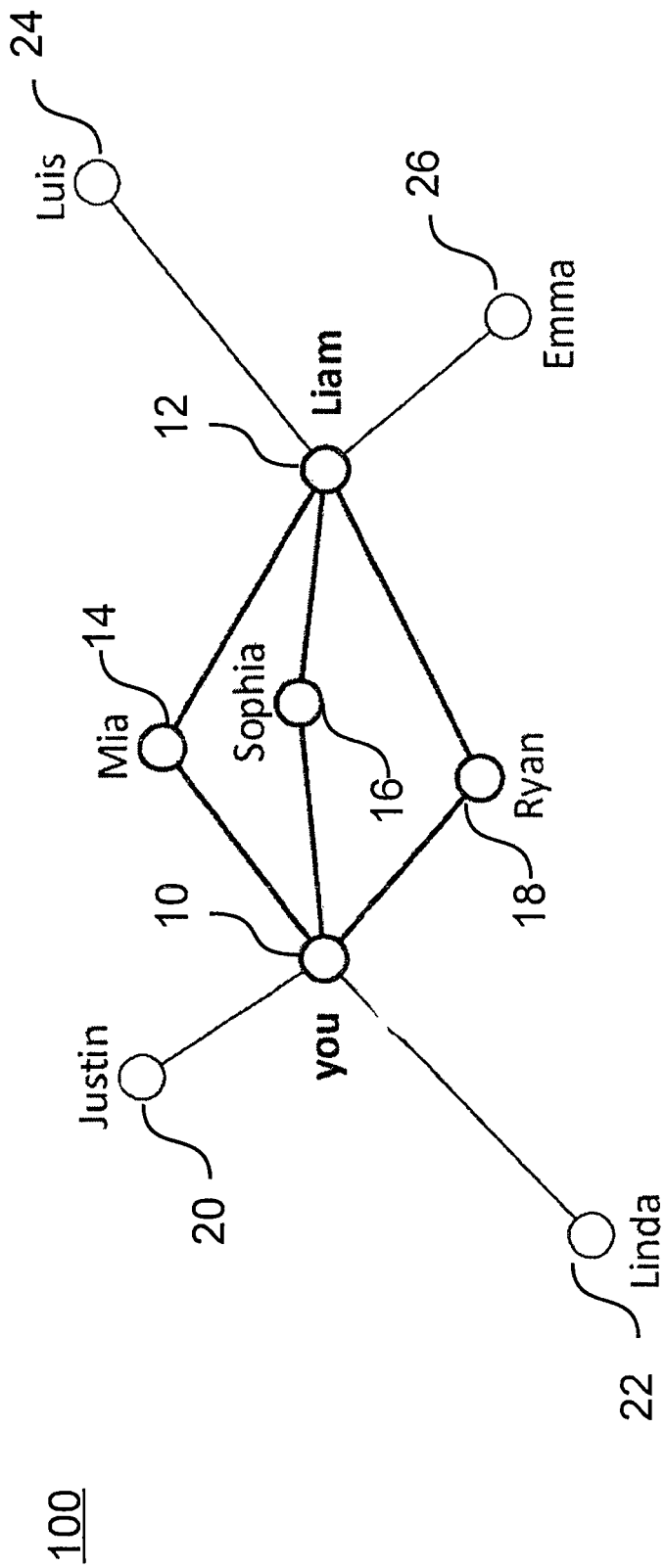
FIG. 1 shows an example of a graph representing a social network.

The following technical terms are used throughout the description. The terms may refer to but are not limited to the following explanations.

Graph Theory Lexicon

A graph G is defined by a set V of vertices and a set E of edges, wherein the edges connect pairs of vertices. An edge e is thus defined by the pair of vertices (u, v) that it connects: e=(u,v), wherein e∈E and u, v∈V. Two vertices connected by an edge are said to be adjacent or neighbors. A list L containing all the edges of a graph G, i.e. all the pairs of connected vertices, is called the adjacency list of the graph G. The graph G is usually denoted as G(V,E). If V is the set of vertices, its cardinality |V| is the number of vertices and similarly |E| is the number of edges. In the following, V and E will be used to denote both the sets and their cardinality.

A subgraph of a graph G is a graph whose vertices are a subset of the vertex set V of G and whose edges are a subset of the edge set E of G.

A bipartite graph G(X, Y; E) is a graph whose vertex set V can be divided into two disjoint sets X and Y, wherein each pair of vertices connected by an edge comprises a vertex belonging to X and a vertex belonging to Y.

The degree of a vertex in a graph G is the number of edges connected to the vertex.

The degree sequence of a graph G is a list of the degrees of all the vertices in the graph G.

A random graph is a graph chosen uniformly at random from the set of all possible graphs on a given set V of vertices with a given degree sequence.

A network motif in a graph is a subgraph whose occurrence is statistically significantly higher than expected in a random graph model.

The adjacency matrix A of a graph G with n vertices is a n×n matrix wherein each entry $a_{uv}$ is either 0 or 1 and $a_{uv}=1$ only and if only (u,v)∈E. In the following the row of the adjacency matrix A corresponding to vertex u will be denoted by $A_u$ and the elements of $A_u$ are the entries $a_{u1}$, $a_{u2}$ . . . of the matrix.

The adjacency matrix of a bipartite graph G(X, Y; E) is fully characterized by a matrix having one row for each vertex u of X and one column for each vertex w of Y. This characterizing matrix is thus also referred to as the adjacency matrix.

The co-occurrence is the number of common neighbors of two vertices in a graph. It is formally defined for vertices u and v of graph G(V,E) as:

$$\text{co-occurrence}(u, v) = \sum_{w \in V} \begin{cases} 1, & \text{if } (u, w) \in E \text{ and } (v, w) \in E \\ 0, & \text{otherwise} \end{cases}$$

Since in the adjacency matrix two vertices are represented by two rows (or two columns), in the following the expressions "co-occurrence of two vertices" and "co-occurrence of two rows" will be used interchangeably.

A similarity measure may be any mathematical quantity whose value indicates the statistical significance of an observed co-occurrence between two vertices, thereby measuring the similarity between the two vertices. The degree of similarity between the two vertices is directly proportional to the statistical significance of their co-occurrence.

Computer Science Lexicon

A cache is a portion of high-speed memory that shortens data access times. One example of high-speed memory is the SRAM, in which bits of information are stored into flip-flops.

A memory controller is a digital circuit that manages read and write operations to the memory.

A one-bit adder is a digital circuit comprising an AND gate and an XOR gate, which enables the addition of two one-bit numbers. A full adder is made from two one-bit adders and an OR gate. A two-bit adder is the combination of a one-bit adder and a full adder. Adders for arbitrarily large binary numbers can be constructed by cascading full adders.

An adder tree is a combination of adders of different sizes hierarchically organized in stages according to the size of the adders: the first stage is formed by m one-bit adders, the second stage by m/2 two-bit adders and so on. The number of stages defines the depth of the adder tree. The results from the i-th stage are supplied to the (i+1)-th stage.

DETAILED DESCRIPTION

In the following text, a detailed description of examples will be given with reference to the drawings. It should be understood that various modifications to the examples may be made. Unless explicitly indicated otherwise, elements of one example may be combined and used in other examples to form new examples.

One possible use of graph representations is in the field of social networks, wherein users can establish connections to people they know, such as friends or colleagues. Each user can be represented by a vertex in a graph with edges connecting him to his contacts. An example of such a graph 100 is given in FIG. 1.

Social networks may provide a recommendation feature suggesting to a user other users he may know. This recommendation feature may be based on an estimate of a similarity between users, which is related to the number of contacts they have in common. With reference to the graph representing the social network, the number of common contacts between two users is exactly the co-occurrence between the two vertices representing the users. Considering for example vertices 10 and 12 of graph 100, their co-occurrence is 3, because both vertices 10 and 12 have edges linking them to vertices 14, 16 and 18. However, this number for the co-occurrence taken alone may be not sufficiently indicative of the degree of similarity between vertices 10 and 12. Indeed, if the corresponding users "you" and "Liam" only have a total of three contacts each, it appears very likely that "you" and "Liam" know each other. Conversely, if "you" and "Liam" have thousands of contacts, the fact that they have three common acquaintances seems to be less relevant. Thus, in order to determine the similarity between vertices 10 and 12, a significance of a co-occurrence equal to 3 may be established.

Therefore the problem of finding similarities in a network can be considered two-fold. First, the co-occurrence between two vertices may be evaluated, i.e. the number of common neighbors may be computed. Second, a procedure to evaluate the significance of an observed value for the co-occurrence may be implemented.

Computation of the Co-Occurrence

Real-world data graphs may have a number of vertices in the order of hundreds of thousands or more and a number of edges usually at least two orders of magnitude larger than the number of vertices. It is therefore computationally challenging to calculate the co-occurrence for large networks.

A graph can be represented in a computer system by at least two different data structures, an adjacency matrix A and an adjacency list L, for example. The adjacency list L only stores the existing edges of the graph, whereas the adjacency matrix A stores the non-existing edges as well, represented by 0 entries. The adjacency list L stores the pairs of vertices as couples of integers, i.e. it stores a number of integers equal to twice the number of edges. The adjacency matrix A only requires one bit per entry, since each entry can only take 0 or 1 as a value.

For example, considering a bipartite graph G(X, Y; E), the total storage requirement for the adjacency matrix A with X rows and Y columns is X*Y bits. The adjacency list L requires 2*E*sizeof(int), wherein sizeof(int) indicates the bits needed to represent an integer number. The range of integer numbers to be represented is 1 to X*Y, because each vertex should have its own unique index to univocally identify an edge. Since an integral type with n bits can encode $2^n$ numbers, sizeof(int) is determined by the lower bound log 2(X*Y). For large networks, sizeof(int) is typically 32 bits.

A feature of real-world data is the sparsity, meaning that the ratio of existing edges to non-existing edges is very low. Indeed, for example more than 98% of the adjacency matrix entries are 0's in many real-world scenarios. Therefore storing an array containing the adjacency list L may be still more space-efficient than storing the adjacency matrix A, although the latter only requires one bit for each entry. Furthermore, finding all the vertices adjacent to a given vertex in the adjacency list L simply requires going through the list and the time necessary for such an operation is proportional to the degree of the vertex. On the other hand, in the adjacency matrix A an entire row must be read. Coming back to the above example for a bipartite graph G(X, Y; E), this operation takes a time proportional to Y.

Since the computation of the co-occurrence is based on finding common neighbors between vertices, the adjacency list L is conventionally used for this purpose, in light of the above considerations about storage space and speed of neighbor search operations.

The present invention instead makes use of the adjacency matrix A to store graphs and, thanks to a specifically designed architecture, the computation of the co-occurrence is made more efficient in comparison to traditional adjacency-list-based computations in CPU clusters, both in terms of energy and memory requirements.

Calculating the co-occurrence between all pairs of vertices in a naive way requires to load the same data many times, making memory a bottleneck. For example, calculating the co-occurrence between two vertices u and v requires loading the corresponding two rows $A_u$ and $A_v$ of the matrix A. When the co-occurrence is later calculated between rows u and w, the same row $A_u$ needs to be loaded.

Figure 2:
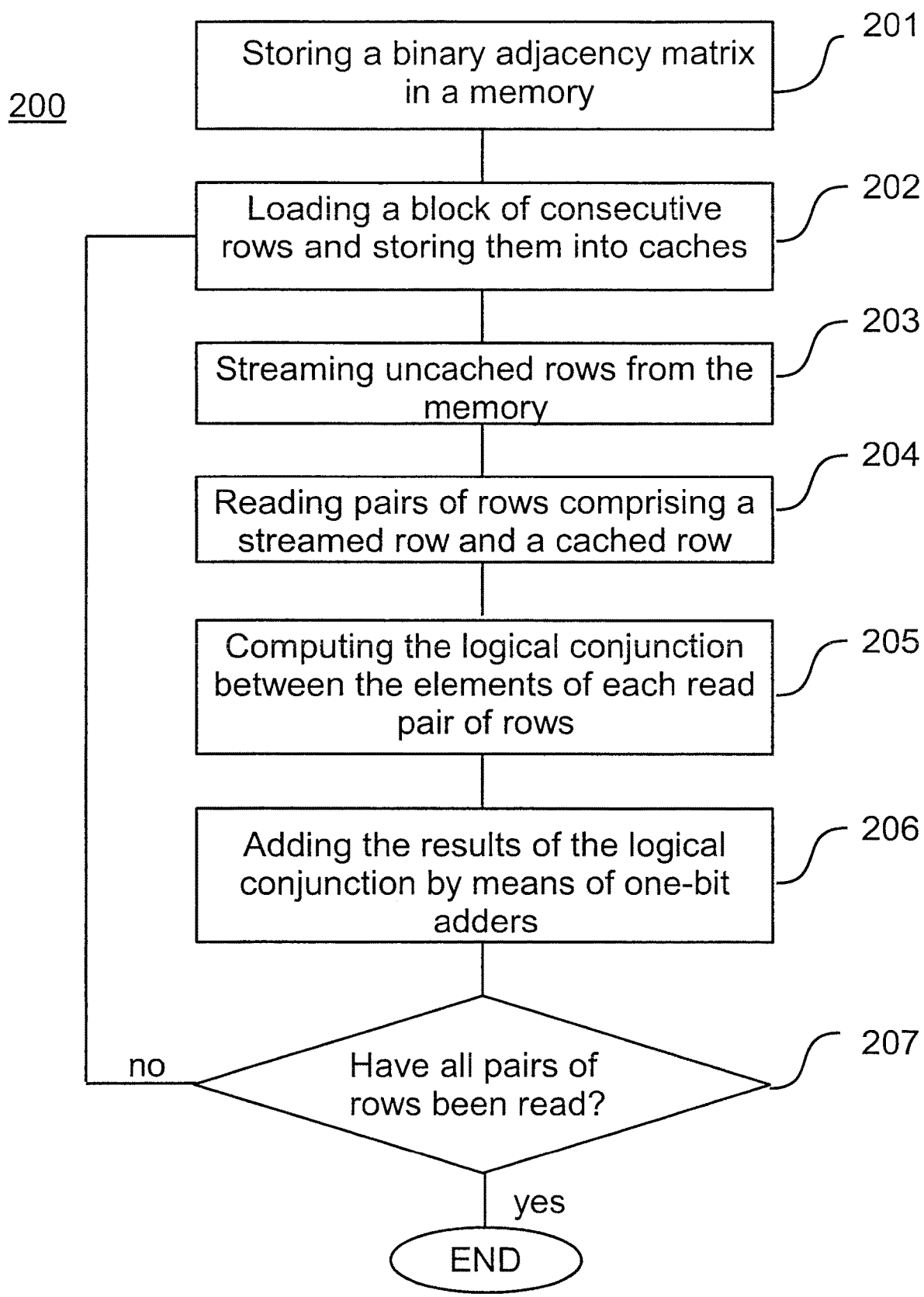
FIG. 2 shows an exemplary method of computing a co-occurrence between two vertices of a graph.
Figure 3:
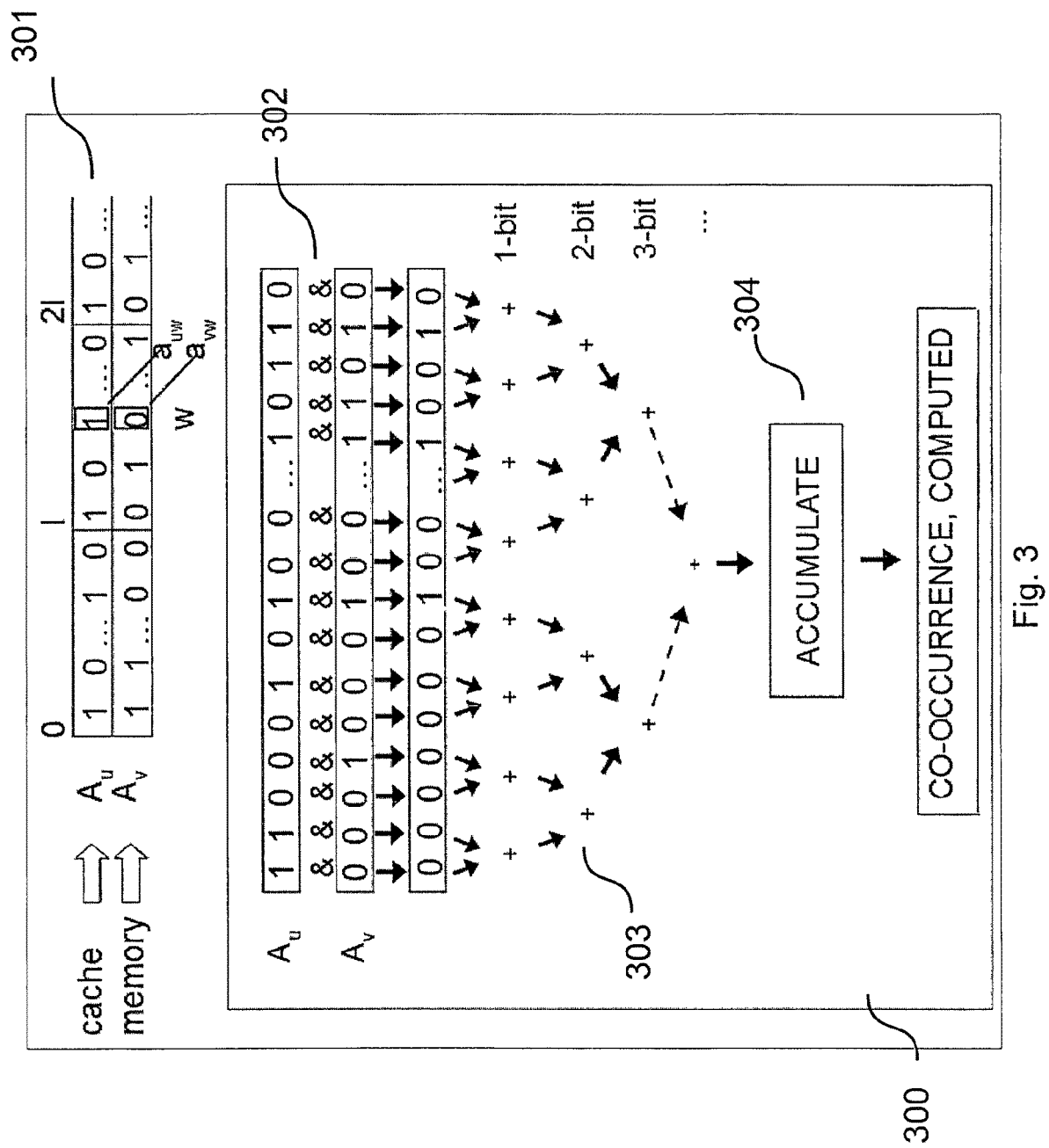
FIG. 3 shows a pictorial representation of a co-occurrence computation module to carry out the exemplary method in FIG. 2.

FIG. 2 shows an exemplary method 200 of computing a co-occurrence between two vertices of a graph that minimizes the data transfer. The method 200 is made feasible by a tailored architecture that comprises, among others, a plurality of caches and a plurality of one-bit adders. FIG. 3 shows a pictorial representation of a co-occurrence computation module to carry out the exemplary method in FIG. 2.

At step 201, the adjacency matrix A representing the graph is saved to a memory as a binary matrix, i.e. a matrix wherein each entry only takes 0 or 1 as a value and is thus stored as a single bit. Given the large size required for the storage of the adjacency matrix A, it is preferable to use as memory a DRAM, which has a low cost because only one transistor and one capacitor are required per bit.

At step 202, a block of consecutive rows of the adjacency matrix A is loaded from the memory and stored into the plurality of caches. For example, if the architecture is provided with K caches, up to K rows $A_u, \ldots, A_{u+k-1}$ may be stored. However, not all the caches have to be filled and the process of storing the rows in the caches may not happen simultaneously for all rows.

At step 203, the rows that have not been cached in step 202 and that follow after the last cached row are streamed from the memory. Indeed, a matrix comprises a set of rows, wherein the top row is usually considered the first row and the one immediately below is the second row and so on. The sequence from the first row to the n-th row is an ordered sequence. At step 203, the rows subsequent to the block of cached rows are streamed from memory, meaning that if K rows $A_u, \ldots, A_{u+K-1}$ have been cached, the streaming process starts from $A_{u+k}$. It should be understood that steps 202 and 203 may present an interplay between each other. That is to say, some rows may be first streamed and then stored in a cache at a later moment.

At step 204, pairs of rows that comprise one streamed row and each one of the cached rows are read. In other words, when streaming a row $A_v$, each one of rows $A_u, \ldots, A_{u+K-1}$ is read in combination with $A_v$, so that pairs $(A_u, A_v), \ldots, (A_{u+k-1}, A_v)$ are read simultaneously while $A_v$ is being streamed.

Having stored $A_u$ in a cache and streaming $A_v$, the co-occurrence between $A_u$ and $A_v$ is computed as follows. The elements of row $A_u$ are the entries $a_{uw}$ of the adjacency matrix A, wherein w spans a range from one to the number of columns. Each column $B_w$ has an intersection with row $A_u$, i.e. element $a_{uw}$, and an intersection with row $A_v$, i.e. element $a_{vw}$. Element $a_{uw}$ of row $A_u$ and element $a_{vw}$ of row $A_v$ are situated at the same position in the two rows, namely the w-th position, as shown in area 301 of FIG. 3. Remembering that column $B_w$ represents vertex w of the graph, it follows from the definition of the adjacency matrix A that, if $a_{uw}=1=a_{vw}$, w is a common neighbor between vertices u and v. Therefore the co-occurrence can be obtained by counting all the positions w at which both $A_u$ and $A_v$ have a 1. Indeed, at step 205, for each one of the read pairs, an operation of logical conjunction is performed between each couple of elements at the same position, i.e. $a_{uw}\&a_{vw}$, wherein denotes the logical operation AND. The result of the logical conjunction is a T for each common neighbor found. The one-bit AND operators 302 are shown in FIG. 3.

The results from step 205 are then summed by means of one-bit adders 303, wherein the sum is the total number of common neighbors, i.e. the co-occurrence between $A_L$, and $A_v$ (step 206). In other words, the operations at step 205 and 206 compute the cardinality of $A_u\&A_v$, which is equivalent to counting common edges.

As explained, the computations at steps 205 and 206 are performed for all pairs $(A_u, A_v), \ldots, (A_{u+k-1}, A_v)$ for each of streamed rows $A_v$. Put differently, the co-occurrences have only been computed for pairs comprising one cached row. A calculation step comprising steps 202 to 206 may have to be repeated until finally all pairs have been read, i.e. until the co-occurrence for all possible pairs of rows in the adjacency matrix A has been computed. When more than one calculation step is required, the memory of the caches may be emptied (deleted) and/or overwritten.

The following algorithm may be used in a preferred implementation of method 200, with r being the number of rows:

```
for u:=1 to r step K do
    k:=0;
    for v:=u to r do
        Stream row A_v from external memory;
        if k≥1 then
            Compare the streamed row with all previously cached
            rows 1 to k and calculate the co-occurrence for the pairs
            (u,v), ..., (u+k-1,v);
        end
        if k < K then
            k:=k+1;
            Store the streamed row in cache k; .
        end
    end
end
```

The cache design of the present invention is optimized for minimal memory access without increasing the bandwidth requirements. In method 200 the accesses to the data are structured in such a way that, once a row has been stored into a cache, it is not necessary to load it a second time. The caches can be filled row by row and each time a row is streamed the co-occurrence between the streamed row and all the previously cached rows is computed. Once the cache is full, one more line can be streamed and then the process can start over again until all the co-occurrences have been computed. In this configuration, the memory may almost always be accessed in sequential order, thus maximizing the memory bandwidth.

Furthermore, using the adjacency matrix to store the graph allows an efficient computation of the co-occurrence, because the calculation reduces to a sum of bits. As discussed above, the computation is encoded in one-bit AND-operators 302 and one-bit adders 303, which may then form the co-occurrence computation module 300. The logic of this module 300 is very efficient and its structure is only possible because of the binary nature of the adjacency matrix A. A plurality of modules 300 can be used in combination with the plurality of caches to parallelize the computations, hence speeding up the process. The presence of m modules 300 may reduce the runtime by a factor m, however it does not necessarily increase the bandwidth requirements to the memory because it may still be just one single row that is streamed through all the modules at each given time. As a consequence, the chip level parallelism is virtually infinite, solving the scalability problem.

The one-bit adders may preferably be combined to form an adder tree. The adder tree provides an efficient data path, because it breaks down the sum of a large number of 1's in smaller sums. In particular, the addition is performed hierarchically, by combining one-bit data into two-bits data, which in turn are summed to yield three-bits data and so forth. Therefore it may maximize the number of low-level operations involving data with a low number of bits and may minimize the number of high-level operations involving data with a high number of bits.

Referring back to steps 202, 203 and 204, the rows may be loaded, streamed and/or read in batches of data, wherein each batch has e.g. a size of l, as shown in area 301 of FIG. 3. The computation module processes then l edges per clock cycle and feeds the partial results of the co-occurrence for each batch to an accumulator 304. The accumulator 304 may thus also be part of the co-occurrence computation module 300. Once all the batches have been processed, the final value of the co-occurrence may be computed.

As explained above, once the co-occurrence is computed, the significance of the obtained value may be evaluated. One approach is illustrated in the following.

Swap Randomization

The significance of a computed value for the co-occurrence can be roughly defined as the likelihood that the result is caused by something other than mere random chance. Referring back to FIG. 1, "you" and "Liam" share three common contacts "Mia", "Sophia" and "Ryan". If this co-occurrence is deemed significant, it may indicate a specific underlying scenario to the network of contacts, such as that these users are colleagues or relatives. Consequently, it would appear likely that "you" and "Liam" know each other. On the other hand, a non-significant co-occurrence may suggest that the three common contacts are the result of a coincidence and the users share only a weak common denominator, such as living in the same, big city.

Therefore it appears sensible to compare the real situation depicted by the graph under analysis to different scenarios that involve the same users albeit with random connections. If the observed co-occurrence is not often found in the random graphs, it may point to an underlying cause for the existing, observed connections.

A powerful technique to generate random graphs from a given graph is the swap randomization, which is based on edge swapping. The process of edge swapping is illustrated in picture 444 of FIG. 4, which shows on the left side a pair of edges (40, 60) and (50, 70). The edges are swapped by swapping the vertices by which they are defined, i.e. by exchanging two vertices between the edges. In other words, one vertex belonging to the first edge (40, 60) and a vertex belonging to the second edge (50, 70) are swapped, so that two different edges are created. As seen on the right side of picture 444, vertices 60 and 70 have been swapped so as to generate edges (40, 70) and (50, 60). Another possibility could be to swap vertices 50 and 60 to generate edges (60, 70) and (40, 50). In bipartite graphs, the swapping operation is restricted to a single implementation, because edges should only connect vertices belonging to different sets.

In order to make a "fair" comparison, the random graphs may maintain the same degree sequence as the original graph. The sorted degree sequence of graph 100 in FIG. 1 is {1, 1, 1, 1, 2, 2, 2, 5, 5}, wherein vertex 10 is an exemplary vertex with degree 5 and vertex 24 is an exemplary vertex with degree 1.

One possible procedure to create independent, random graphs with the same degree sequence is to swap a sufficient number of pairs of edges, drawn uniformly at random, if and only if no multiple edges would arise due to the swap. In other words, preferably, the swapping only takes place when two new edges are created by the swap, i.e. two edges that did not previously exist.

Figure 4:
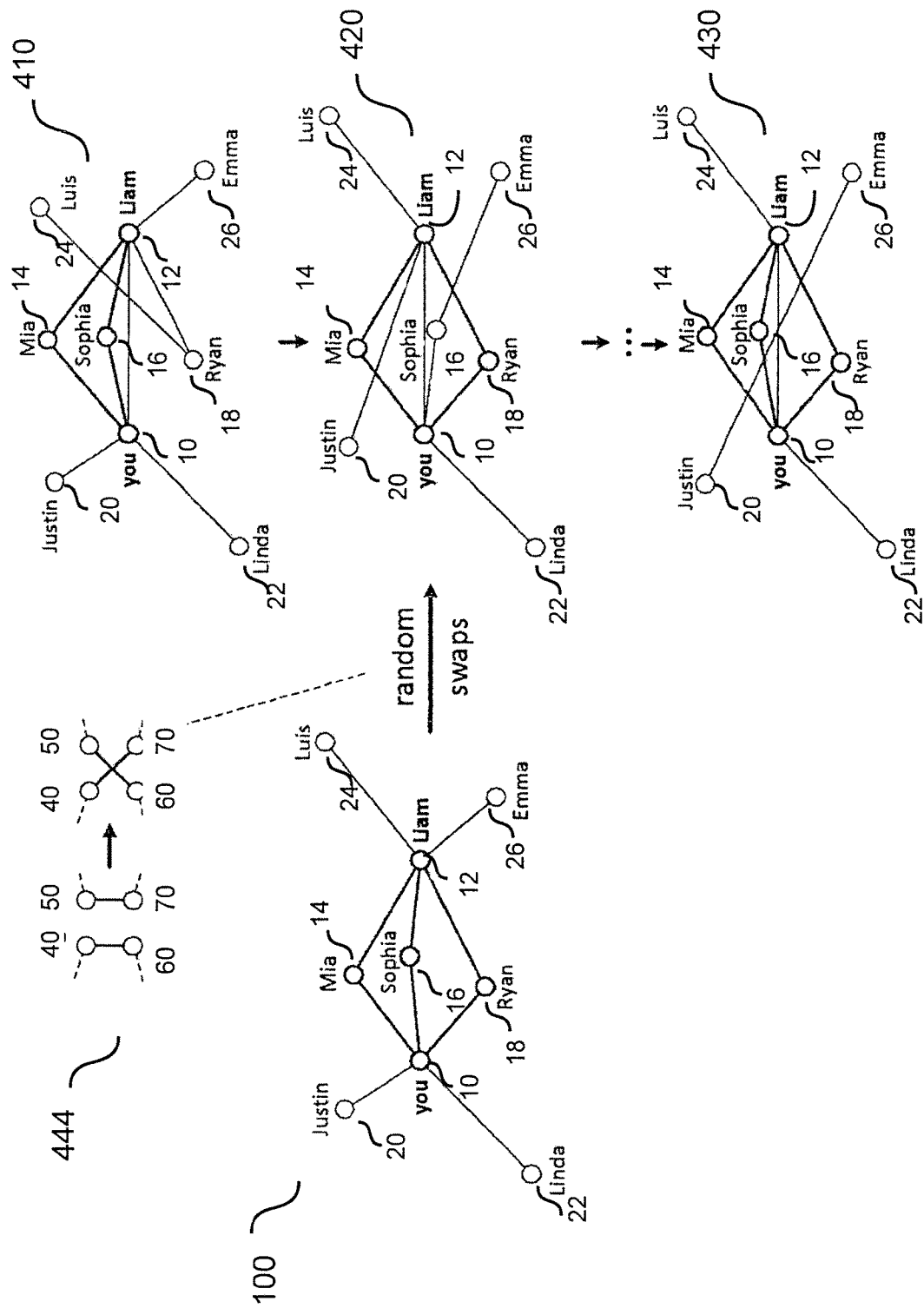
FIG. 4 shows some examples of random graphs with a fixed degree sequence.

FIG. 4 shows some examples of random graphs 400 with a fixed degree sequence generated from graph 100. For instance, random graph 410 is obtained by swapping edges (10, 18) and (12, 24) of graph 100 to generate edges (10, 12) and (18, 24). Swapping edges (10, 14) and (12, 18) of graph 100 into edges (10, 18) and (12, 14) would not be allowed because the resulting swapped edges (10, 18) and (12, 14) already exist in graph 100.

In order to compute the co-occurrence, only one data structure was needed, namely the adjacency matrix A. When using only the adjacency matrix A to perform the swap randomization, the runtime complexity of the swapping algorithm is O(number of rows+number of columns), as explained in the following.

In order to ensure the required randomness, a random number generator may be used. To draw two random edges, two random, numbers N1, N2 are generated. The edges corresponding to the two random numbers N1, N2 must be identified and as previously discussed, such an operation is not trivial with the adjacency matrix. A matrix is stored in the memory as a sequence of rows. One option would be to loop through the entries of the matrix to find the N1-th and the N2-th edges, i.e. the N1-th and the N2-th entries equal to 1. Knowing in advance how many edges each row of the matrix has, i.e. the degree of the vertex corresponding to that row, could direct the search so that it is only required to loop through an individual row for each random number. For this purpose, a list of the degrees for each row has to be stored, which has then a size equal to the number of rows. In the worst-case scenario, the whole list of the degree has to be looped (runtime complexity O(number of rows)) to find the appropriate row and then the whole row has to be looped to find the edge (runtime complexity O(number of columns)), resulting in an overall runtime complexity of O(number of rows)*O(number of columns)=O(number of rows+number of columns). Once the random edges are identified, it is straightforward (i.e. O(1)) to check whether the swapped edges exist, because an edge is a pair of vertices, i.e. a pair of coordinates that uniquely pinpoints each entry in the adjacency matrix A.

On the other hand, identifying an edge is a trivial operation of O(1) if the graph is stored as an adjacency list L, because the two random edges can simply be identified as the N1-th and the N2-th elements of the adjacency list L. However, checking whether the swapped edges exist requires searching in the adjacency list L through all the pairs comprising either one of the unswapped vertices. Therefore the runtime complexity may be approximated as O(degree of first unswapped vertex)+O(degree of second unswapped vertex).

Combining the adjacency matrix A and the adjacency list L an algorithm with runtime complexity of O(1) can be achieved, by using the adjacency list to identify the random edges and the adjacency matrix to check the existence of the swapped edges.

Figure 5:
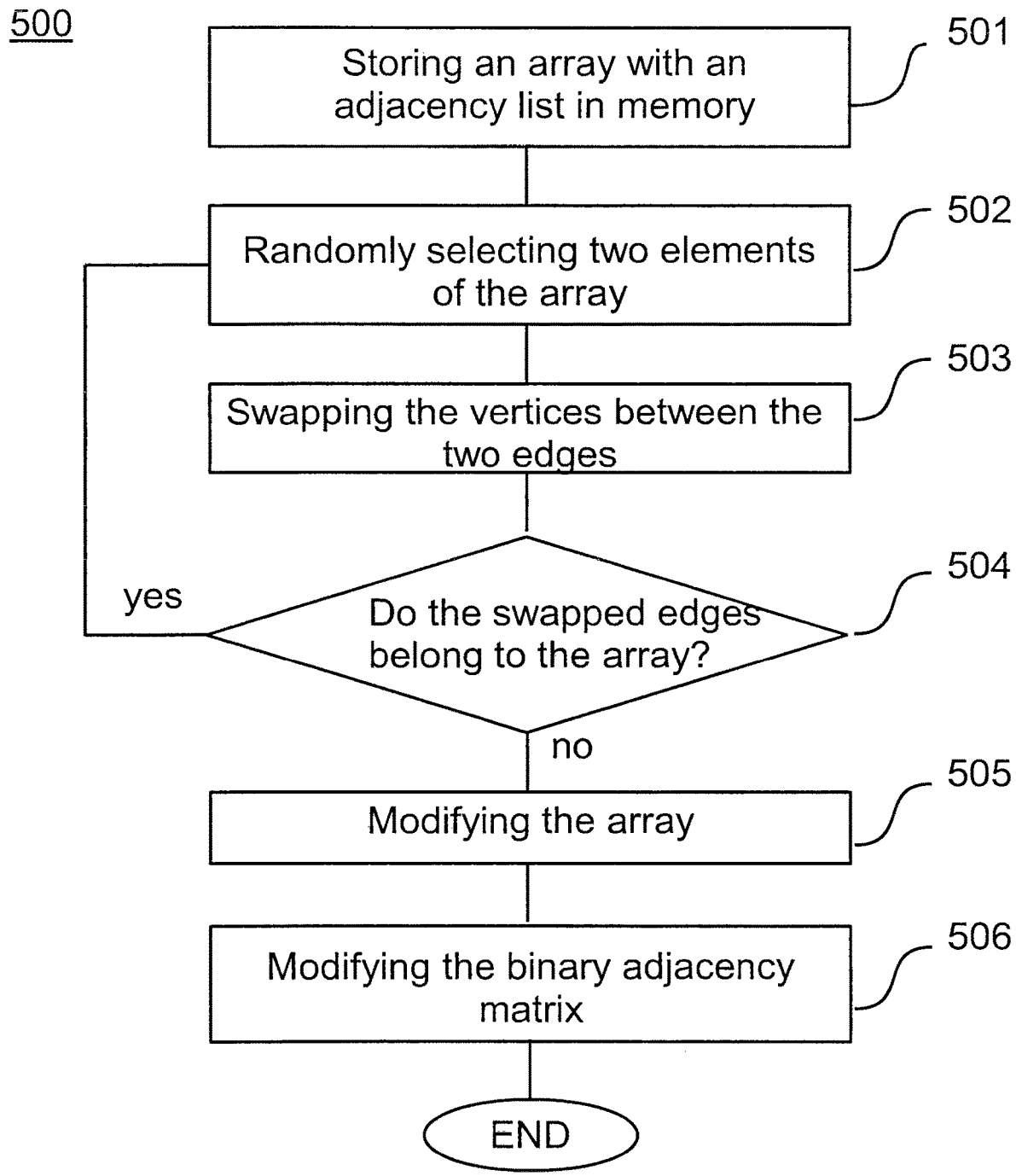
FIG. 5 shows an exemplary method of generating random graphs with a fixed degree sequence.

FIG. 5 shows an exemplary method 500 of generating random graphs with a fixed degree sequence starting from a given graph using the adjacency matrix A and the adjacency list L.

Assuming that the adjacency matrix A has already been stored in memory for the co-occurrence computation, at step 501 an array containing the adjacency list L for the graph is stored in the memory. This means that the elements of the array are the edges of the graph.

At step 502, two elements of the array are selected at random, for example by generating two random numbers. For generating the random numbers, a Mersenne twister 19937 algorithm may be used, in which four random reads and six random writes are necessary per swap.

At step 503, the vertices belonging to the edges corresponding to the selected elements of the array are swapped, as discussed with reference to picture 444 above.

At step 504, it is checked whether the swapped edges exist already, i.e. whether the swapped edges are elements of the array. As explained above, the check is performed on the adjacency matrix A. If the swapped edges exist, two new elements are selected at random, exemplarily by generating two new random numbers, until two non-existent swapped edges are found.

Then the method proceeds to step 505, at which the array is modified to delete the randomly selected edges and insert the swapped edges as two new elements.

At step 506, the adjacency matrix A is modified accordingly, meaning that the '1' entries corresponding to the randomly selected edges are changed to 0 and the '0' entries corresponding to the previously non-existent swapped edges are change to 1.

The swap randomization process of steps 502-506 may be repeated more than once.

The following algorithm may be applied in a preferred implementation of method 500, wherein the process is repeated s times:

```
for s do
    Generate two random numbers: a, b ∈ [1, E];
    Read the two edges: (u, x) := L_a and (v, y):=L_b;
    Check existence of swapped edges by reading: i:=a_uy and j:=a_vx;
    if both edges do not exist: i=j=0 then
        Swap the edges by writing: a_ux:=0; a_vy:=0; a_uy:=1; a_vx:=1;
        Update edge list by writing L_a:= (u, y); L_b:=(v, x);
    end
end
```

The iteration of the swapping may be advantageous when a plurality of random graphs or samples are generated by means of a Markov chain Monte Carlo (MCMC). A new random graph can be generated from the previous one by randomly swapping a specified number of edges, starting from the original graph. Preferably, the swapping is realized in a finite-state machine. The number of iterations conventionally used to obtain a random graph independent of the previous one is E*log E, since it has been proven that E*log E swaps guarantee that each edge is touched at least once on average. However in a preferred embodiment E*log E iterations are only used to generate the first random graph from the original graph. It has been empirically found that to generate a random graph from another random graph a lower number of iterations may be used, namely (number of rows)*log(number of rows). Therefore a burn-in phase with E*log E iterations followed by swappings with (number of rows)*log(number of rows) iterations may generate a suitable set of random graphs via the MCMC.

Similarity Measures

The result of the swap randomization is a random graph with the same degree sequence of the original graph. Random graphs are necessary to evaluate the significance of an observed co-occurrence. The evaluation is made by statistical means, which require a large number of samples to provide reliable estimates.

Therefore an ensemble comprising a plurality of random graphs with the same degree sequence must be generated and the co-occurrence for each of the random graphs must be computed.

Figure 6:
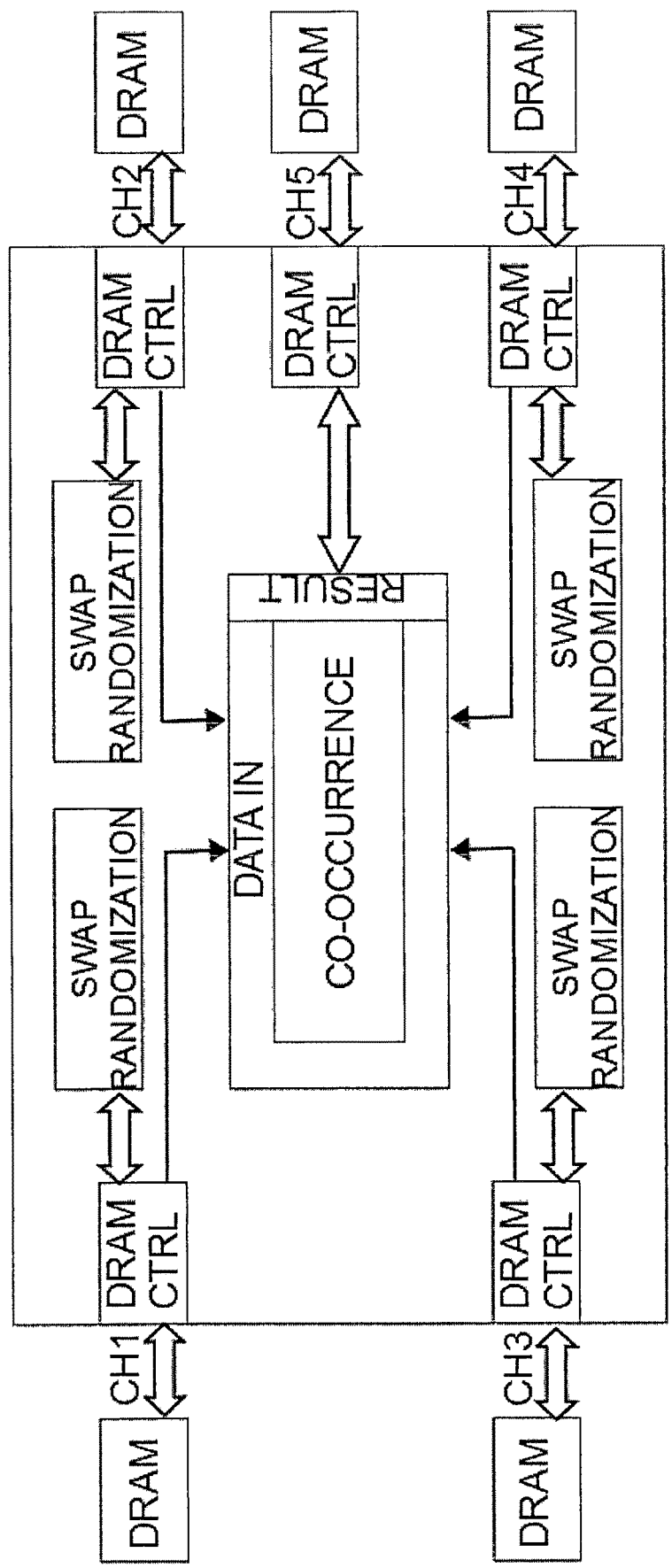
FIG. 6 shows an exemplary dedicated architecture for network motif detection based on the co-occurrence.

FIG. 6 shows an exemplary dedicated architecture comprising swap randomization modules, a co-occurrence module and memory controllers to access an external memory such as a DRAM. The swap randomization modules and the co-occurrence module may work on datasets residing in each of the DRAMs in a round-robin fashion, while multiple swap randomization modules can work in parallel. Preferably, if there are N memory controllers, N−1 swap randomization modules may be employed, assuming one memory controller is dedicated for the results.

A set of random graphs with the same degree sequence constitutes a fixed degree sequence model (FDSM). Once the plurality of co-occurrences in the FDSM have been computed, different quantities can be used to evaluate the statistical significance of the co-occurrence observed in the original graph. In one approach the expected co-occurrence in the ensemble of random graphs, i.e. the mean co-occurrence over all the samples, is computed. The observed co-occurrence is corrected by the expected co-occurrence and the difference is called leverage. The leverage can then be normalized by the standard deviation of the expected distribution to yield the z-score. An alternative approach is to use the empirical p-value, i.e., the probability to pick a random graph instance in which the co-occurrence is at least as high as in the observed network.

The similarity measures, i.e. the leverage, the z-score and the p-value are formally defined as follows for an ensemble of t samples:

$$co\text{-}occurrence_{FDSM}(u, v) = \text{mean}(\{co\text{-}occurrence_i(u, v)\}_{i=1,\ldots,t})$$

$$leverage(u, v) = co\text{-}occurrence(u, v) - co\text{-}occurrence_{FDSM}(u, v)$$

$$p\text{-}value(u, v) = \sum_{i=1}^{t} \begin{cases} 1, & \text{if } co\text{-}occurrence_i(u, v) > co\text{-}occurrence(u, v) \\ 0, & \text{otherwise} \end{cases}$$

$$z\text{-}score(u, v) = \frac{leverage(u, v)}{\text{standard deviation}(\{co\text{-}occurrence_i(u, v)\}_{i=1,\ldots,t})}$$

The higher the leverage or the z-score, or the lower the p-value, the more similar the vertices are considered to be.

FIG. 7 shows an exemplary method 700 of computing similarity measures starting from a plurality of random graphs generated according to method 500 and their co-occurrences computed according to method 200.

The execution of method 700 requires a third data structure in addition to the adjacency matrix A and the adjacency list L, namely a result matrix. The variables to be stored in the result matrix needed to compute the above similarity measures are the following: co-occurrence (u,v), $\Sigma_i$ co-occurrence$_i$(u,v), $\Sigma_i$ [co-occurrence$_i$(u,v)]$^2$ and a p-value count.

The result matrix is stored in the memory and contains partial results for calculating the leverage, the p-value and z-score for all the pairs in the graph. In a post-processing step, all similarity measures can be efficiently calculated with these partial results.

At step 701 a plurality of random graphs are generated from the first graph by repeating steps 502 to 506 of method 500 a plurality of times. Preferably, the plurality of random graphs are generated by a MCMC, as discussed above.

At step 702, the co-occurrence is computed for each of the random graphs by performing steps 202 to 207 and then stored together with the co-occurrence in the original graph in the result matrix at step 703. In detail, each entry of the result matrix may contain the co-occurrences computed for each pair of vertices (u,v), so that the result matrix is an upper triangular matrix. Specifically, each entry in the matrix comprises the variables identified above, namely co-occurrence (u,v), $\Sigma_i$ co-occurrence$_i$(u,v), $\Sigma_i$ [co-occurrence$_i$(u,v)]$^2$ and a p-value count. In particular, the partial results in the result matrix may be updated every time a row has finished being streamed. This involves reading the corresponding entry from the memory, updating, and writing it back. It is worth noticing that this process does not have to be performed in each clock cycle, only once per complete row. Therefore the arithmetic operators 800 assigned to this task, such as those shown in FIG. 8, can be shared among multiple co-occurrence computation modules 300.

After the co-occurrences for all samples in the ensemble of random graphs have been computed, the final similarity measures can be calculated e.g. on a CPU by accessing once the result matrix in the memory (step 704).

The following algorithm may be applied in a preferred implementation of method 700 for a graph G(V,E), wherein t random graph samples are generated by iterating the swapping procedure s times:

---
$G_0$:=G;
for i:= 1 to t do
    $G_i$:=$G_{i-1}$;
    for s do
        Choose two edges at random in $G_i$ and swap them, if no
        duplicated edge arises from the swap;
    end
    Calculate co-occurrence$_i$ (u,v) for each (u,v) ∈ (VxV);
end

---

Parallelization is easily possible by using multiple instances of the architecture according to the present invention, with each instance working on independent samples. For n instances this reduces the total time by a factor of n. They start all with the same initial graph and the results can be easily combined at the end by summation The present invention proposes a precisely tailored embedded architecture for computing similarities based on one special network motif, the co-occurrence. It is based on efficient and scalable building modules that exploit well-tuned algorithmic refinements and an optimized graph data representation approach. The computation consists of three main parts:
    Swap randomization: generate random graph samples from an observed graph with the same degree sequence.
    Co-occurrence calculation: calculate the co-occurrence of all pairs of vertices for the observed graph and for each random graph sample.
    Similarity measures: generate leverage, p-value, and z-score based on the computed co-occurrences.

Three data structures are stored in an external memory: an adjacency matrix representing the graph, an adjacency list representing the edges of the graph, and a result matrix. The proposed architecture comprises at least one swap randomization module that accesses both the adjacency matrix and the adjacency list, a plurality of co-occurrence computation modules that access the adjacency matrix and a result module that accesses the result matrix. The plurality of co-occurrence computation modules provide an efficient cache design that allows the architecture to be scaled without requiring a higher memory bandwidth. The result module, which contains arithmetic operators, may be integrated with the plurality of co-occurrence computation modules.

One example of such an architecture can be an application specific integrated circuit (ASIC), in the following referred to as 'chip'. The chip comprises then the swap randomization module and the plurality of co-occurrence computation modules (which include the result module as well). Furthermore, the chip comprises memory controllers to access the external memory, preferably at least one for each data structure. At each given time, the at least one swap randomization module is operating on one controller and the co-occurrence computation modules on the others. When both are finished they switch over. As explained with reference to FIG. 6 above, a plurality of N memory controllers may be used to access the external memory and N−1 swap randomization modules may be correspondingly provided. The rest of the chip may be occupied by I/O and interconnect structures, for example.

A preferred implementation of the chip is described in the following for a 28 nm process chip. Three 64 bit double data rate type three synchronous (DDR3) memory controllers are integrated in the chip. In particular, two 2 GB DDR3-1600 DIMMs are equipped for the adjacency matrix and the adjacency list and a 4 GB module for the result matrix. Each co-occurrence computation module has a cache of 64 kB, targeting a frequency of 400 MHz. Four co-occurrence computation modules are synthesized in a single cell. For a 64 bit DDR channel at 800 MHz, 256 edges can be processed per clock cycle when running the cell at 400 MHz. Correspondingly, the adder tree in each module has a width of 128 adders at the top and a depth of seven stages. The operations to calculate the partial results for the similarity (i.e. the result module) may be designed with 64 bit for the squares and 32 bit for the rest, being shared over the cell. A plurality of cells may be combined in a grid of 5 times 12. Therefore the chip may comprise 240 co-occurrence computation modules in total. To distribute the data to the caches or to stream further rows of the matrix a tree-like replication network may be used, while for the results a shift register over the whole chip may be used. Hence the architecture is perfectly scalable and can perform 240*256=61,440 graph operations per clock cycle. The following table shows the characteristics of each module:

| Component | Size [mm$^2$] | Frequency [MHz] |
| --- | --- | --- |
| Swap randomization module | 0.01 | 400 |
| Cell of 4 co-occurrence computation modules | 0.572 | 400 |
| DDR controller | 4.8 | 800 |
| I/O and interconnect structures | 2.4 | 400 |

The whole chip has a size of 51.2 mm$^2$. To demonstrate the performance of this design, similarity measures have been computed for the Netflix dataset. Netflix, a commercial video streaming service, has released 100,480,507 user ratings for all of their 17,700 movies from 480,189 users. While users give ratings in the range of 1-5, an input graph with edges between users and movies whenever the rating is 4 or 5 only is considered. As a result, the input graph has 17,769 movies, 478,615 users, and 56,919,190 edges. This graph is a bipartite graphs and the interest is focused on the similarity between movies. The adjacency matrix has then the movies as rows and the users as columns.

The swap randomization module takes 2.14 s to generate a new random graph by swapping the dataset, with a number of iteration of the swapping set to (number of rows)*log (number of rows) according to the results previously discussed. Since the number of rows is the number of movies, the number of iterations is 6 259 639. A total number of 10000 samples has been used to ensure sufficient convergence.

The co-occurrence computation modules, working in parallel, take 3.25 s to calculate the coocc partial results from one graph. During this time the result memory controller is active for 20% of the time. In total, it takes 9.0 hours to process the Netflix data, with a power consumption of 11.7 W. The detailed power consumptions are as follows:

| Component | Power [W] |
| --- | --- |
| Swap randomization module | 0.002 |
| Cell of 4 co-occurrence computation modules | 0.123 |
| DDR controller | 0.8 |
| I/O and interconnect structures | 0.56 |

Further, the power consumption of the external memory as well as a 20% overhead of 2.63 W are added to account for necessary board components (ethernet, clocks) and the power supply. Post-processing and calculating the final similarity measures for the Netflix data takes on e.g. an Intel node below one second, the CPU node is therefore not included in the energy calculations, since it is free to use during the rest of the time. An overall power consumption of 15.8 W is hence estimated to be necessary to process the Netflix dataset.

The same similarity measures were computed on standard CPU server nodes for a comparison. A 10-node standard dual-socket Intel cluster with 6 cores was used. To make a fair comparison, the parallel cluster implementation has been adequately optimized. Since swapping is hard to parallelize, each core works on its own random graph or sample during swapping, generating 12 samples on one server node. Afterwards, the partial results are updated one sample after another, while all the 12 cores work in parallel on one sample to reduce memory requirements. Among nodes, the parallelization is the same as for the chip with each node working on independent samples.

For the cluster implementation, the swapping works on the same adjacency matrix A as in the proposed architecture to minimize random accesses. At the same time an adjacency list is kept in memory that contains the user IDs of the people who have rated the film for each movie. This adjacency list is used to calculate the co-occurrence, since using the matrix for co-occurrence calculations is very inefficient on the CPU, as discussed above.

A comparison between the parameters characterizing the computation performance in the chip and in the cluster is given in the following table:

| Implementation | Memory [GB] (used/available memory) | Runtime [hour] | Power [W] | Energy [MJ] |
| --- | --- | --- | --- | --- |
| 10 node Intel cluster (Each node: 2x Intel Xeon X5680@12x 3.33 GHz, 32 nm; 48 GB DDR3 memory) | 202/480 | 8.5 | 3700 | 114 |
| Chip (Node including: ASIC with 240 modules, 28 nm; 8 GB DDR3 memory; board (ethernet, clocks), power supply.) | 4.6/8 | 9.0 | 15.8 | 0.51 |

It can be seen that, for the same throughput, the chip requires less than 0.5% of power and therefore energy per task. At the same time, it requires only 2.3% of the external memory.

Therefore the proposed architecture clearly outperforms standard CPU server nodes, both with respect to throughput and energy, but also total memory requirements. Since the main limitation in this application is in general the memory bandwidth utilization to the external memory, the architecture is optimized for minimal memory accesses. For that purpose, instead of using adjacency lists as normally done in CPU clusters, the complete adjacency matrix is used, but with 1 bit entries only. This is not practical in generic computing platforms in this way. With that approach the data transmission in general and in particular the memory bandwidth is reduced. As a result, the proposed architecture, compared to an Intel cluster, uses 44× less memory and is 224× more energy efficient. These superior characteristics allow in particular the use of this architecture in power- and space-limited data-centers and for constructing motif detection systems targeted to process very large graphs with reasonable power consumption and system costs.

The dedicated architecture has been described with reference to net-work motif detection based on the co-occurrence. It is problem-independent and universally applicable to a wide application range, for instance as a special accelerator device in bigger system contexts. Due to its modular approach, the proposed design can also be enhanced to other motifs.

The invention claimed is:

1. A computer-implemented method for determining co-occurrences in at least one graph with n vertices and E edges, wherein each edge is defined by a pair of vertices, the method comprising:
   storing a binary adjacency matrix representing a first graph in a memory; and
   performing a calculation step for the first graph, wherein the calculation step comprises:
      loading a block of at most K consecutive rows of the binary adjacency matrix from the memory and storing each row into one of K caches;
      streaming each of the subsequent uncached rows of the binary adjacency matrix from the memory;
      reading pairs of rows comprising a streamed row and each one of the cached rows;
      computing the logical conjunction between each couple of elements of the rows at the same position in the rows for each read pair of rows; and adding the results of the logical conjunction for all the couples of elements in each read pair by one-bit adders to obtain the co-occurrence;
wherein the calculation step is repeated for consecutive blocks of rows in the binary adjacency matrix until all the pairs of rows of the binary adjacency matrix have been read.

2. The computer-implemented method of claim 1, wherein the one-bit adders are combined to form an adder tree.

3. The computer-implemented method of claim 1, wherein:
the loading, streaming and/or reading comprise loading, streaming and/or reading the data from the rows in batches;
the computing and the adding are performed separately for each batch, yielding an intermediate sum for each batch; and
the intermediate sums are fed to an accumulator.

4. The computer-implemented method of claim 1, further comprising:
storing an array containing an adjacency list representing the first graph in the memory, wherein the elements of the array are the edges of the first graph;
performing a generation step of a random graph by:
performing at least once a swap randomization step comprising:
randomly selecting two elements of the array;
swapping the vertices between the edges corresponding to the two elements to obtain two swapped edges;
checking whether the swapped edges are elements of the array;
if both swapped edges are not elements of the array, modifying the array by deleting the randomly selected elements and inserting the swapped edges as two new elements; and
modifying the binary adjacency matrix correspondingly to represent the random graph;
repeating the generation step a plurality of times to generate a plurality of random graphs;
performing the calculation step for each of the plurality of random graphs;
storing the co-occurrence for a pair of rows in the first graph and the co-occurrence for the same pair of rows in each of the plurality of random graphs in a result matrix in the memory; and
evaluating the statistical significance of the co-occurrence for the pair of rows in the first graph from the result matrix.

5. The computer-implemented method of claim 4, wherein evaluating the statistical significance comprises:
computing a mean value of the co-occurrences in the plurality of random graphs; and
computing the difference between the co-occurrence in the first graph and the mean value.

6. A system for determining co-occurrences in at least one graph with n vertices and E edges, wherein each edge is defined by a pair of vertices, the system comprising:
a memory to store a binary adjacency matrix representing a first graph;
K caches to store consecutive rows of the binary adjacency matrix;
a plurality of one-bit adders; and
at least one processing unit operable to perform a calculation step for the first graph, wherein the calculation step comprises:
loading a block of at most K consecutive rows of the binary adjacency matrix from the memory and storing each row into one of the K caches;
streaming each of the subsequent uncached rows of the binary adjacency matrix from the memory;
reading pairs of rows comprising a streamed row and each one of the cached rows;
computing the logical conjunction between each couple of elements of the rows at the same position in the rows for each read pair of rows;
adding the results of the logical conjunction for all the couples of elements in each read pair by the plurality of one-bit adders to obtain the co-occurrence;
wherein the calculation step is repeated for consecutive blocks of rows in the binary adjacency matrix until all the pairs of rows of the binary adjacency matrix have been read.

7. The system of claim 6, wherein the plurality of one-bit adders are combined to form an adder tree.

8. The system of claim 7, wherein the adder tree has a width of at least 128 adders at the top and a depth of at least seven stages.

9. The system of claim 6, further comprising an accumulator, wherein:
the loading, streaming and reading comprise loading, streaming and reading the data from the rows in batches;
the computing and the adding are performed separately for each batch, yielding an intermediate sum for each batch; and
the intermediate sums are fed to the accumulator.

10. The system of claim 6, wherein the at least one processing unit is further operable to:
store an array containing an adjacency list representing the first graph in the memory, wherein the elements of the array are the edges of the first graph;
perform a generation step of a random graph by:
performing at least once a swap randomization step comprising:
randomly selecting two elements of the array;
swapping the vertices between the edges corresponding to the two elements to obtain two swapped edges;
checking whether the swapped edges are elements of the array;
if both swapped edges are not elements of the array, modifying the array by deleting the randomly selected elements and inserting the swapped edges as two new elements; and
modifying the binary adjacency matrix correspondingly to represent the random graph;
repeat the generation step a plurality of times to generate a plurality of random graphs;
perform the calculation step for each of the plurality of random graphs;
store the co-occurrence for a pair of rows in the first graph and the co-occurrence for the same pair of rows in each of the plurality of random graphs in a result matrix in the memory; and
evaluate the statistical significance of the co-occurrence for the pair of rows in the first graph from the result matrix.

11. The system of claim 6, wherein the at least one processing unit comprises a plurality of memory processors.

12. The system of claim 6, wherein the memory is a dynamic random access memory.

13. The system of claim 6, wherein each of the K caches is a static random access memory.

14. The system of claim 6, wherein each of the K caches has a size of $2^j$ kB, with j being at least 8, and K is in the range of at least 8 to 300.

15. A non-transitory computer-readable medium comprising computer-readable instructions, which, when loaded and executed on a computer system, cause the computer system to perform operations for determining co-occurrences in at least one graph with n vertices and E edges, wherein each edge is defined by a pair of vertices, the operations comprising:
storing a binary adjacency matrix representing a first graph in a memory; and
performing a calculation step for the first graph, wherein the calculation step comprises:
loading a block of at most K consecutive rows of the binary adjacency matrix from the memory and storing each row into one of K caches;
streaming each of the subsequent uncached rows of the binary adjacency matrix from the memory;
reading pairs of rows comprising a streamed row and each one of the cached rows;
computing the logical conjunction between each couple of elements of the rows at the same position in the rows for each read pair of rows; and
adding the results of the logical conjunction for all the couples of elements in each read pair by one-bit adders to obtain the co-occurrence;
wherein the calculation step is repeated for consecutive blocks of rows in the binary adjacency matrix until all the pairs of rows of the binary adjacency matrix have been read.

16. The non-transitory computer-readable medium of claim 15, wherein the one-bit adders are combined to form an adder tree.

17. The non-transitory computer-readable medium of claim 15, wherein:
the loading, streaming and/or reading comprise loading, streaming and/or reading the data from the rows in batches;
the computing and the adding are performed separately for each batch, yielding an intermediate sum for each batch; and
the intermediate sums are fed to an accumulator.

18. The non-transitory computer-readable medium of claim 15, wherein the operations further comprises:
storing an array containing an adjacency list representing the first graph in the memory, wherein the elements of the array are the edges of the first graph;
performing a generation step of a random graph by:
performing at least once a swap randomization step comprising:
randomly selecting two elements of the array;
swapping the vertices between the edges corresponding to the two elements to obtain two swapped edges;
checking whether the swapped edges are elements of the array;
if both swapped edges are not elements of the array, modifying the array by deleting the randomly selected elements and inserting the swapped edges as two new elements; and
modifying the binary adjacency matrix correspondingly to represent the random graph;
repeating the generation step a plurality of times to generate a plurality of random graphs;
performing the calculation step for each of the plurality of random graphs;
storing the co-occurrence for a pair of rows in the first graph and the co-occurrence for the same pair of rows in each of the plurality of random graphs in a result matrix in the memory; and
evaluating the statistical significance of the co-occurrence for the pair of rows in the first graph from the result matrix.

19. The non-transitory computer-readable medium of claim 15, wherein the evaluating the statistical significance comprises:
computing a mean value of the co-occurrences in the plurality of random graphs; and
computing the difference between the co-occurrence in the first graph and the mean value.

* * * * *